United States Patent [19]

Moriguchi et al.

[11] Patent Number: 4,520,381
[45] Date of Patent: May 28, 1985

[54] POLYCHROMATIC IMAGE SENSOR

[75] Inventors: Haruhiko Moriguchi; Masami Kurata, both of Kanagawa, Japan

[73] Assignee: Fuji Xerox Co., Ltd., Tokyo, Japan

[21] Appl. No.: 455,635

[22] Filed: Jan. 5, 1983

[30] Foreign Application Priority Data

Jan. 13, 1982 [JP] Japan ................................. 57-2684

[51] Int. Cl.³ ............................................ H01L 27/14
[52] U.S. Cl. ...................................... 357/30; 250/226; 357/20; 357/55
[58] Field of Search ............................ 357/30, 20, 55; 250/226, 211 J; 356/407

[56] References Cited

U.S. PATENT DOCUMENTS 4,379,636  4/1983  Yoshida ........................... 250/226

Primary Examiner—James W. Davie
Assistant Examiner—Georgia Epps
Attorney, Agent, or Firm—Sughrue, Mion, Zinn, Macpeak and Seas

[57] ABSTRACT

A polychromatic image sensor having a semiconductor for converting an optical signal into an electrical signal, in which the sensor is provided with at least two PN-junctions of which the depth from a light incident plane varies continuously. A plurality of sensors may be arranged into a sensor array.

6 Claims, 13 Drawing Figures

POLYCHROMATIC IMAGE SENSOR

BACKGROUND OF THE INVENTION

This invention relates to a photoelectric conversion element or image sensor used for an original document reading apparatus such as a facsimile system. In particular, it relates to a polychromatic image sensor having color separation and reading capability for two or more colors.

FIG. 1 illustrates a conventional polychromatic image sensor of the type as mentioned above. In FIG. 1, reference numeral 1 denotes a film of silicon oxide (SiO$_2$), 2 denotes a P-type diffusion region (hereinafter referred to as a P-region), 3 denotes an N-type diffusion region (hereinafter referred to as an N-region), and 4 denotes a second P-region. Reference numerals 5, 6 and 7 respectively denote first, second and third electrode lead conductors respectively led out from the P-region 2, N-region 3, and P-region 4. Reference numerals 8 and 9 denote a first and a second PN-junction, respectively.

FIG. 2 is an equivalent circuit diagram of a polychromatic image sensor of the type as described above. A photodiode 10 is defined by the P-region 2 and the N-region 3 of FIG. 1. A photodiode 11 is defined by the N-region 3 and the P-region 4 of the sensor. The second electrode lead conductor 6 is coupled from the junction between the respective cathodes of the photodiodes 10 and 11. The first and third electrode lead conductors 5 and 7 are lead out from the respective anodes of the photodiodes 10 and 11.

The polychromatic image sensor of FIG. 1 may have the color separation and reading capability because, when light of various frequencies impinges the silicon, the coefficient of absorption varies as shown in FIG. 3. Consequently, there is a known relationship between wavelength of light and absorption into the silicon.

FIG. 4 shows in graph form a characteristic with the distance (x) from the light incident surface of silicon read along the x-axis and the light quantum reaching percentage (%) read along the y-axis with the number of light quantum $\phi_0$, and wavelength as parameters. From FIGS. 3 and 4, it will be appreciated that as the wavelength of light decreases, the silicon absorbs light more effectively and, on the contrary, as the wavelength becomes longer, the light reaching distance in the silicon increases.

Accordingly, it will be apparent from the configuration of the polychromatic image sensor that the first PN-junction 8 can be reached by light of short wavelengths as well as light of long wavelengths, while the second PN-junction 9 cannot generally be reached by short wavelength light which has been already absorbed. Accordingly, information including short wavelength light can be obtained from the first photodiode 10, while information excluding short wavelength light can be obtained from the second photodiode 11.

The characteristics as shown in FIG. 5 have been reported as obtained in the polychromatic image sensor shown in FIG. 1. In FIG. 5, curves 10a and 11a denote the characteristics of the first and second photodiodes 10 and 11, respectively. It will be seen from the characteristics that the first photodiode 10 has high sensitivity to short wavelength light and, on the contrary, the second photodiode 11 has high sensitivity to long wavelength light.

In the polychromatic image sensor shown in FIG. 1, however, there is a drawback in that the first and second PN-junctions 8 and 9 are formed in parallel with the silicon oxide film 1. Specifically, to obtain a polychromatic image sensor having a desired characteristic, it is necessary to exactly form the depth or distance from the silicon oxide film to each of the first and second PN-junction planes and therefore, it is difficult to produce such a polychromatic image sensor having a desired characteristic. Moreover, it is difficult to accurately produce two or more PN-junctions.

SUMMARY OF THE INVENTION

An object of the present invention is to eliminate the drawbacks in the conventional polychromatic image sensor and to provide a polychromatic image sensor in which a desired characteristic of the sensor can be easily obtained and two or more PN-junctions can be easily and accurately produced.

This and other objects of the invention are obtained in a polychromatic image sensor provided with at least two PN-junctions of which the depth from a light incident plane varies continuously. A plurality of such sensors may be arrayed.

The invention will be described in detail by referring to the drawing and the description of the preferred embodiment that follows.

DETAILED DESCRIPTION OF THE PREFERRED EMBODIMENT

Figure 6A:
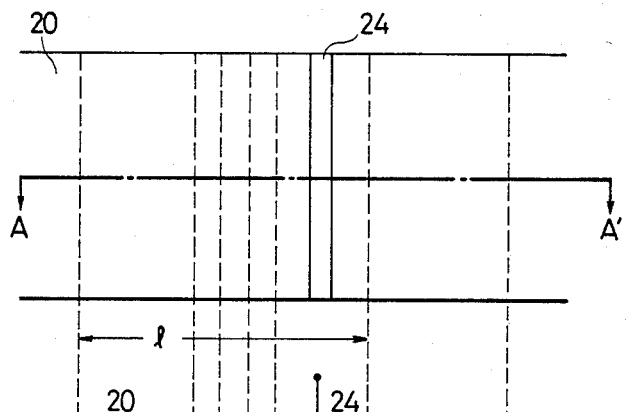
FIG. 6A is a plan and, FIG. 6B a cross-sectional view of a first embodiment according to the present invention.
Figure 6B:
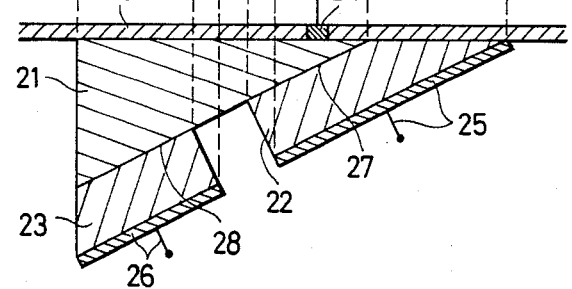

A first preferred embodiment of the present invention will now be described. FIG. 6 illustrates a first preferred embodiment of the present invention in which FIG. 6A is a plan view thereof and FIG. 6B is a cross-section along the line A—A'. In FIG. 6B, reference numeral 20 denotes a silicon oxide film (SiO$_2$), 21 denotes a P-region, 22 and 23 denote first and second N-regions, respectively, numerals 24, 25 and 26 denote a first, a second, and a third electrode, and numerals 27, 28 denote a first and a second PN-junction, respectively.

Figure 7:
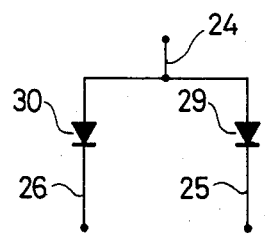
FIG. 7 is a circuit diagram equivalent to FIG. 6 configuration.

FIG. 7 shows an equivalent circuit of the polychromatic image sensor according to the first embodiment of the present invention. In FIG. 7, a photodiode 29 is defined by the P-region 21 and the N-region 22 and a second photodiode 30 is defined by the P-region 21 and the N-region 23. The first, second and third electrodes 24, 25, and 26 correspond to those having the same reference numerals in FIG. 6.

Figure 1:
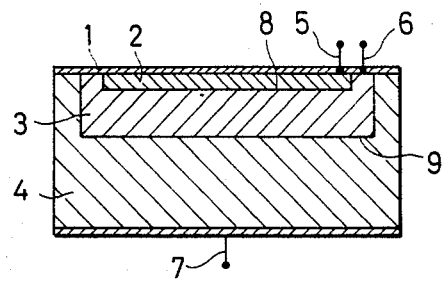
FIG. 1 is a cross-sectional view of a conventional polychromatic image sensor.
Figure 2:
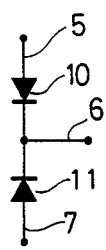
FIG. 2 is a circuit diagram equivalent to FIG. 1 configuration.
Figure 3:
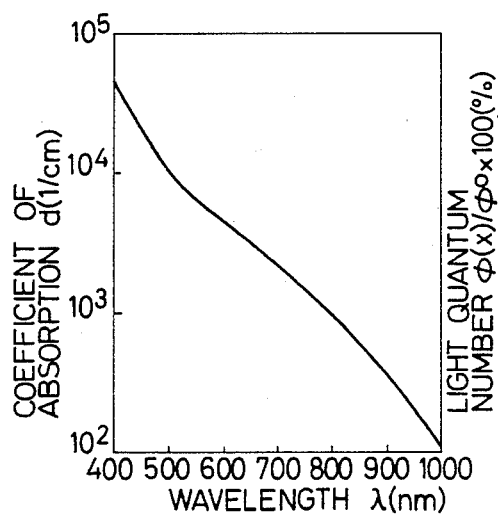
FIG. 3 is a graph showing the relation between the coefficient of light absorption in silicon and the wavelength of light.
Figure 4:
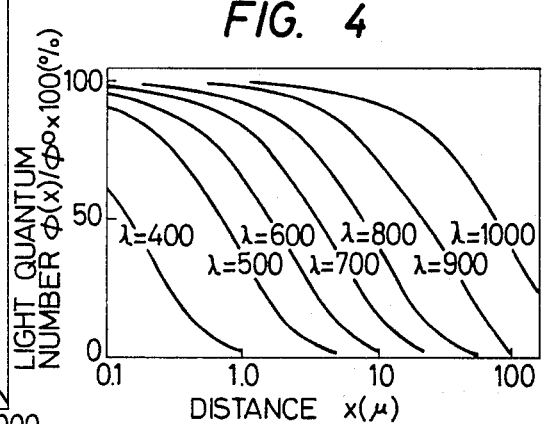
FIG. 4 is a graph showing the relation between the light absorption in silicon and the wavelength of light.
Figure 5:
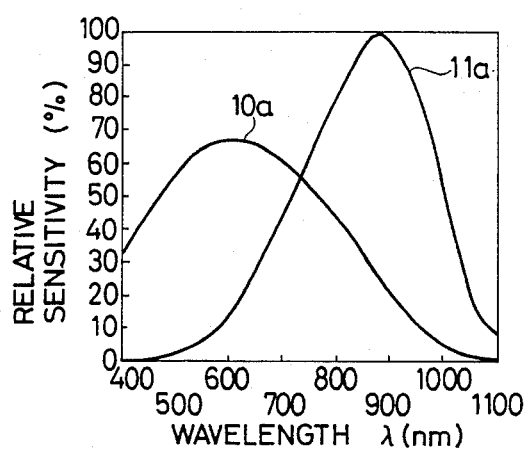
FIG. 5 is a graph showing the relation between the relative sensitivity of the sensor shown in FIG. 1 and the wavelength of light.

In the thus arranged polychromatic image sensor, as is apparent from FIG. 6B, the distance between the silicon oxide film 20 and the first PN-junction 27 is different from that between the silicon oxide film 20 and the second PN-junction 28. Accordingly, if light of differing wavelengths falls on the silicon oxide film, the wavelength distribution of the light which reaches the first PN-junction 27 is different from that of the light which reaches the second PN-junction 28. Consequently, the first and second photodiodes 29 and 30 differ from each other in relative sensitivity to the wavelength, so that the approximate characteristics shown in FIG. 5 can be obtained.

The reason why such sensitivity can be obtained has been already described and therefore the detailed description thereof is omitted, vis-a-vis the description of this embodiment.

When the polychromatic image sensor according to the first embodiment is produced, the length l in FIG. 6 is selected to be 10 $\mu m \sim 20 \mu m$. When optical information from an original document is converted into an electrical signal in such a polychromatic image sensor, the optical information is compressed through an optical system, for example, by a factor 0.2 and then supplied to the polychromatic image sensor. This means, accordingly, that the information over 50 $\mu m \sim 100 \mu m$ on the original document is inputted into the polychromatic image sensor. Although the first and second PN-junctions 27 and 29 are laterally shifted in the polychromatic image sensor according to the first embodiment, the shift of the PN-junctions is, as described above, irrelevant because the area of the document to be inputted on the polychromatic image sensor is very small.

Figure 8:
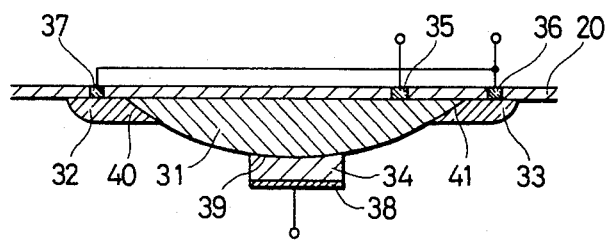
FIG. 8 is a cross-sectional view of a second embodiment according to the present invention.
Figure 9:
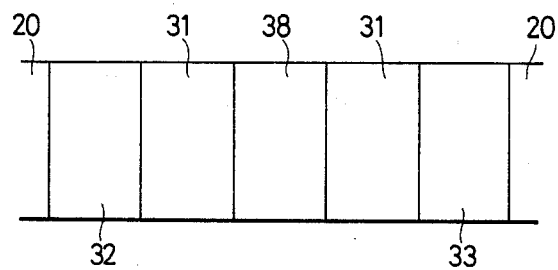
FIG. 9 is a plan view of FIG. 8.

FIG. 8 illustrates a second embodiment of the present invention. In FIG. 8, reference numeral 20 denotes a silicon oxide film, 31 denotes a P-region, 32, 33 and 34 denote a first, a second and a third N-region, respectively, 35, 36, 37 and 38 denote electrodes, 39 denotes a first PN-junction and 40 and 41 denote second PN-junctions. FIG. 9 is a plan view when FIG. 9 is viewed from its lower side. FIG. 9 illustrates the second embodiment and it is not always necessary that the boundary between the P-region and the N-regions extend in a straight line.

This embodiment functions as a polychromatic image sensor similar to the first embodiment because the distance between the silicon oxide film 20 and the first PN-junction 39 is different from that between the silicon oxide film 20 and the second PN-junction 40. In this embodiment, the distance does not vary linearly as in the first embodiment, but it still varies continuously as a function of the radius of curvature defining the boundary of the P-region 31.

Figure 10:
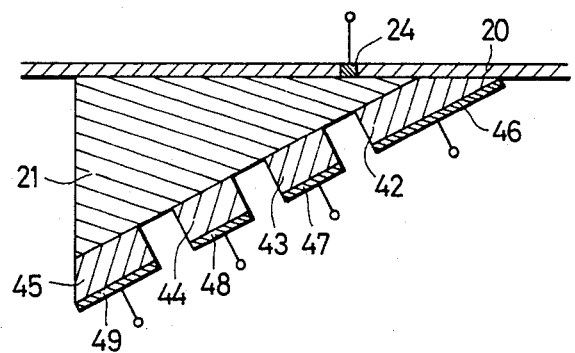
FIG. 10 is a cross-sectional view of a third embodiment according to the present invention.

FIG. 10 illustrates a third embodiment of the present invention. This embodiment is different from the first embodiment shown in FIG. 6 in that an N-region is divided into four parts. In FIG. 10, reference numerals 42, 43, 44 and 45 are silicon N-regions and elements 46, 47, 48 and 49 are electrodes corresponding to the N-regions. Other reference numerals denote the same components as those having the same numerals identified in FIG. 6. Thus, by increasing the number of N-regions and corresponding terminals, the equivalent circuit will have a corresponding increased number of parallel branches. It will be appreciated that the number of N-regions may be varied.

In each of the embodiments as described above, there is an advantage over the prior art in that the distance from the silicon oxide film to the PN-junction does not require high accuracy since the depth from the silicon oxide film to the PN-junction gradually continuously varies. Hence, strict coating tolerances in manufacture are not needed. There is a further advantage in that more than two PN-junctions can be easily made as shown in FIG. 10 so that light having various wavelength distribution can be converted into electrical signals.

Figure 11:
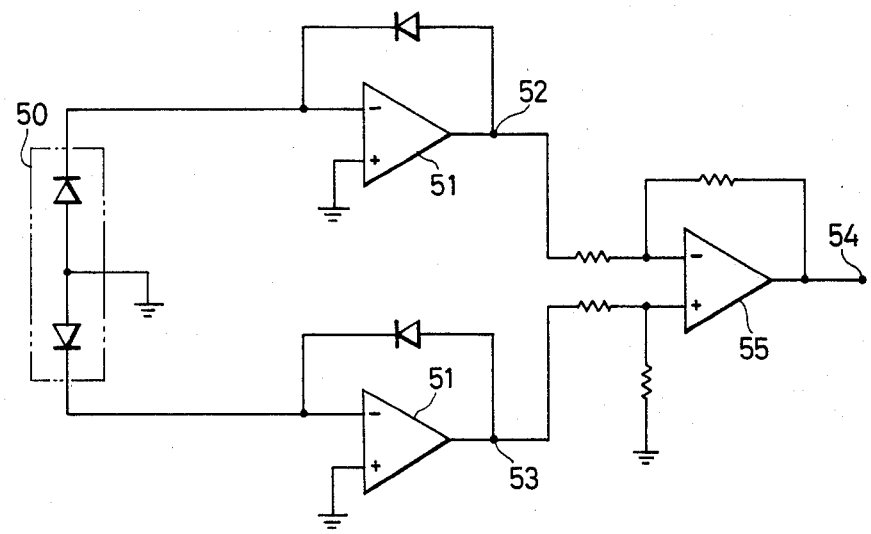
FIG. 11 is a diagram of a signal processing circuit to which the polychromatic image sensor is applied.

FIG. 11 illustrates a signal processing circuit for processing signals by using the polychromatic image sensor according to the present invention. In FIG. 11, reference numeral 50 denotes a polychromatic image sensor according to the present invention, for example, FIG. 6, 51 denotes operational amplifiers and 52, 53 and 54 are terminals. A third amplifer is shown as element 55 receiving the outputs from amplifiers 51.

Figure 12:
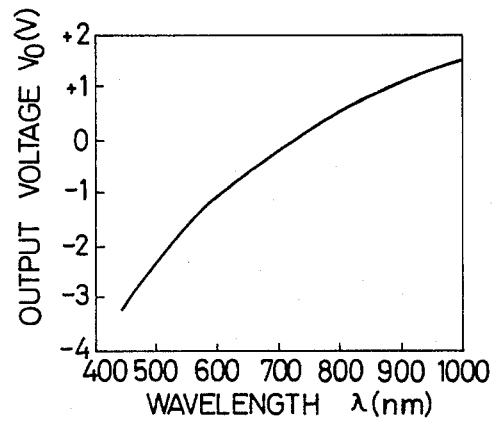
FIG. 12 is a graph showing the relation between an output voltage of FIG. 11 circuit and the wavelength of light, for explaining the chromatic or color information which can be obtained from the circuit of FIG. 11.

In the signal processing circuit of FIG. 11, light intensity information can be obtained from the terminals 52 and 53 as outputs from the respective diodes. Further, an output voltage as a function of color, that is, color information, can be obtained at the terminal 54 by combining outputs 52, 53 into a third operational amplifier 55. FIG. 12 is a graph of the relation between the output voltage $V_0$ and the wavelength, which was obtained by measuring the output voltage $V_0$ at the terminal 54 of the signal processing circuit to which the polychromatic image sensor (for example, FIG. 6) according to the present invention was connected. If a sensor is used with more than two PN-junctions, the number of amplifier circuits 51 will increase.

Although description has been made with respect to a single polychromatic image sensor, it will be appreciated that a plurality of such polychromatic image sensors disposed in one direction may be used as a line chromatic or color sensor.

As aforementioned, according to the present invention, an improvement in the sensor is effectuated since the distance from the silicon oxide film to the PN-junction does not require high accuracy since the depth from the silicon oxide film to the PN-junction gradually continuously varies. There is another advantage in that two or more PN-junctions can be easily made.

What is claimed is:

1. A polychromatic semiconductor image sensor for converting an optical signal into an electrical signal comprising a light incident surface, a region of a first semiconductor type formed below said light incident surface and positioned away from the direction in which light becomes incident on said light incident surface, a plurality of second regions of a second semiconductor type adjoining said first region to define at least two PN-junctions with the depth of the PN-junctions from said light incident surface continuously varying, and output electrodes.

2. The polychromatic semiconductor image sensor or claim 1, further comprising a silicon dioxide film disposed on said light incident surface.

3. The polychromatic semiconductor image sensor of claim 1, wherein said PN-junctions are disposed on a straight line between said first region and said plurality of second regions and said depth continuously linearly varies.

4. The polychromatic semiconductor image sensor of claim 1, wherein said plurality of second regions are spaced apart from each other.

5. The polychromatic semiconductor image sensor of claim 1, wherein said PN-junctions are disposed on an arcuate surface between said first region and said plurality of second regions and said depth continuously nonlinearly varies.

6. The polychromatic semiconductor image sensor of claim 1, further comprising processing circuit means coupled to said output electrodes for producing first outputs indicative of light intensity across said sensor and a second output indicative of the color of incident light.

* * * * *